United States Patent [19]

Herndon

[11] Patent Number: 4,484,311
[45] Date of Patent: Nov. 20, 1984

[54] SYNCHRONOUS SENSE AMPLIFIER

[75] Inventor: William H. Herndon, Sunnyvale, Calif.

[73] Assignee: Fairchild Camera & Instrument Crop., Mountain View, Calif.

[21] Appl. No.: 387,111

[22] Filed: Jun. 10, 1982

[51] Int. Cl.$^3$ .................... G11C 7/00; G11C 11/40
[52] U.S. Cl. .................................. 365/190; 365/205
[58] Field of Search ............ 365/205, 189, 190, 202; 307/530, 279

[56] References Cited

U.S. PATENT DOCUMENTS 4,168,539 9/1979 Anderson ........................... 365/190

Primary Examiner—Joseph A. Popek
Attorney, Agent, or Firm—Ronald Craig Fish; Kenneth Olsen; Carl L. Silverman

[57] ABSTRACT

A circuit for use in controlling a memory cell coupled to a word line W and to first and second bit lines B1 and B2 includes an enabling flip-flop 20 having set terminal S connected to a source of enabling signals and a reset terminal R connected to an OR gate 22; a word line addressing circuit 25 connected to the output of the enabling flip-flop 20 and to the word line W, and having a terminal ADDR for receiving address information; first and second read/write circuits 29 and 30 connected to corresponding first and second bit lines B1 and B2, respectively, each of the read/write circuits 29 and 30 including a control node WRC and an output node SADO; a logic gate 22 having an output coupled to the reset terminal and having input nodes SADO 0 and SADO 1 connected to the corresponding output nodes of the read/write circuits 29 and 30, and an output flip-flop 33 connected the output nodes SADO 0 and SADO 1 of the read/write circuits 29 and 30.

9 Claims, 3 Drawing Figures

WRITE

READ

SYNCHRONOUS SENSE AMPLIFIER

BACKGROUND OF THE INVENTION

1. Field of the Invention

This invention relates to circuits for reading data from, and writing data into, memory cells. In particular, the invention relates to a sense amplifier circuit allowing more precise control of threshold voltages during operation of a memory cell.

2. Description of the Prior Art

Typical prior art sense amplifier circuits are shown in, for example, Mukai et al., "Ultra High Speed 1K-bit-RAM with 7.5ns Access Time" 1977 ISSCC Digest of Technical Papers, pp 78, 79.

Unfortunately, the circuits described therein do not provide sufficiently fast read access time, because the read threshold must be set at substantially greater potential than the level of the non-address word lines. Furthermore, in some of these circuits it is necessary to recover the wordline that is being deaddressed at the beginning of each cycle, and this further delays read access time.

SUMMARY OF THE INVENTION

This invention provides a synchronous sense amplifier circuit in which the read threshold for the bit lines may be set at a value which is only slightly greater than the level of the deaddressed word lines, thereby speeding read access time. Furthermore, because the sense amplifier of this invention begins recovering the addressed word line as soon as the data has been received, it is unnecessary to recover the wordline which is being deaddressed at the beginning of each cycle. Thus read access time is further improved.

In one embodiment a sense amplifier circuit for use and controlling a memory cell coupled to a word line and to first and second bit lines comprises an enabling flip-flop having first and second input terminals and having an output terminal, the first input terminal for being connected to a source of clock signals or an appropriate sequence initiating signal; a word line addressing circuit connected to the output of the enabling flip-flop and to the word line, and having a terminal for receiving address information; first and second read/write circuits connected to corresponding first and second bit lines, each of the read/write circuits including a control mode for receiving control signals and an output node; and logic gate means having an output connected to the second input terminal of the enabling flip-flop, and having first and second input nodes connected to the corresponding output node of each of the first and second read/write circuits.

DETAILED DESCRIPTION OF THE PREFERRED EMBODIMENT

Figure 1:
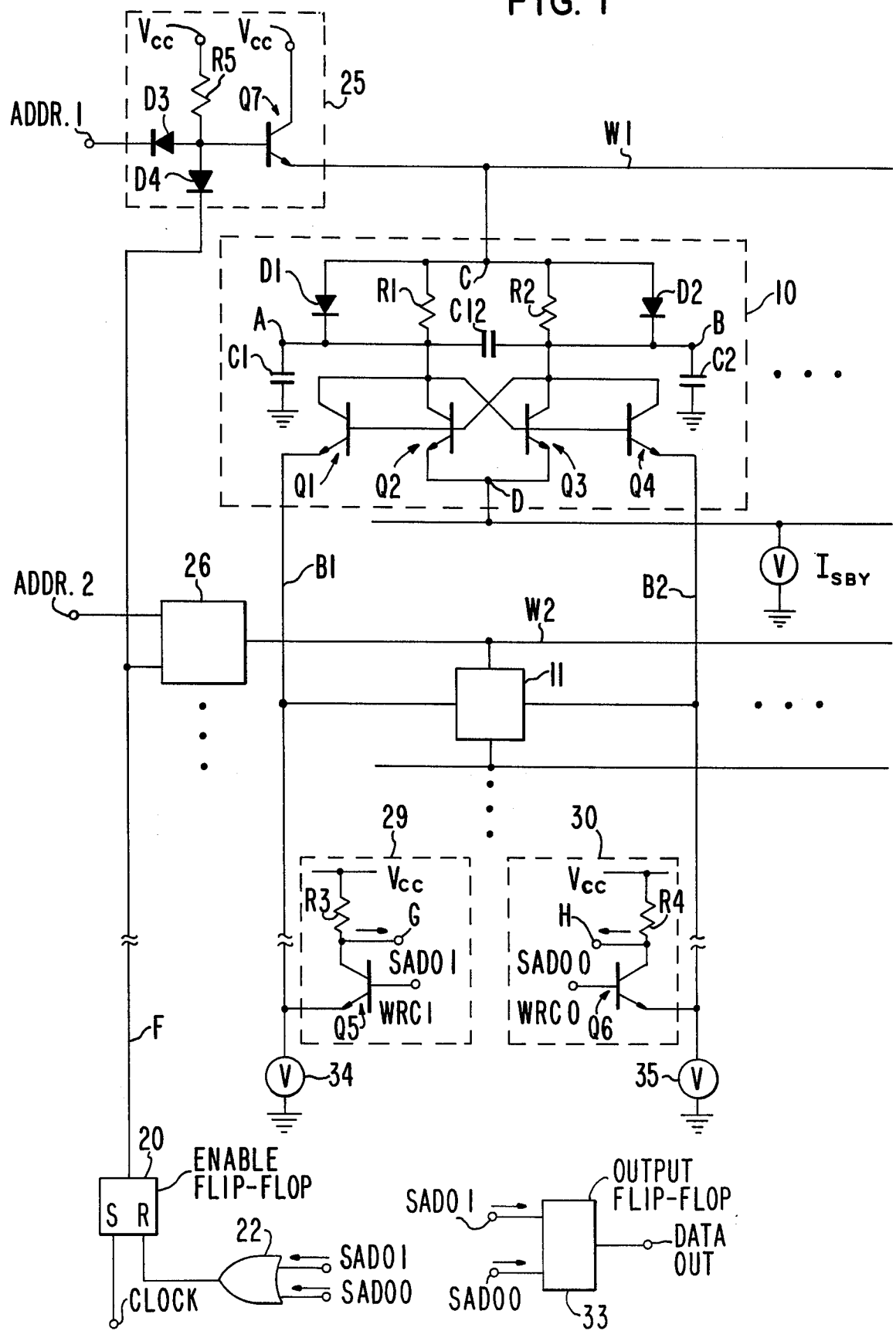
FIG. 1 is a schematic of one embodiment of the sense amplifier circuit of this invention.

A schematic of one embodiment of the sense amplifier circuit of this invention is shown in FIG. 1 in conjunction with a memory cell 10. As shown memory cell 10 is coupled to a first word line W1 and a pair of bit lines B1 and B2. One memory cell 10 is shown in detail; a second memory cell 11 is shown schematically, and other rows and columns of memory cells corresponding to cells 10 and 11 are indicated by the ellipses.

The sense amplifier circuit associated with the array of memory cells depicted in FIG. 1 includes a word line addressing circuit 25 associated with word line W1. Word line addressing circuit 26 is associated with word line W2, and other word line addressing circuits are indicated by the ellipsis. A plurality of the word line addressing circuits 25 and 26 are coupled to the enablAing flip-flop 20 which has a set input S connected to an enabling signal which will typically be a clock signal or sequence initiating signal. The reset input R of flip-flop 20 is connected to an OR logic gate 22. Each word line addressing circuit 25 includes a transistor Q7 coupled between an address input terminal ADDR and the appropriate word line W. The word line addressing circuit also includes a pair of diodes D3 and D4 and a resistor R5.

Each bit line in the memory array includes a read/write circuit 29 and 30. In FIG. 1 read/write circuit 29 is coupled to bit line B1, while read/write circuit 30 is connected to bit line B2. The output terminal SADO (sense amplifier data out) of each read/write circuit is coupled to OR gate 22 and to an output flip-flop 33. Each bit line B1 and B2 is coupled to a corresponding current source 34 and 35.

The operation of the sense amplifier circuit will be explained in conjunction with memory cell 10, although it will be understood that the particular memory cell active at any specific time will depend upon the address information supplied. The read operation will be described first, followed by the write operation.

Figure 2:
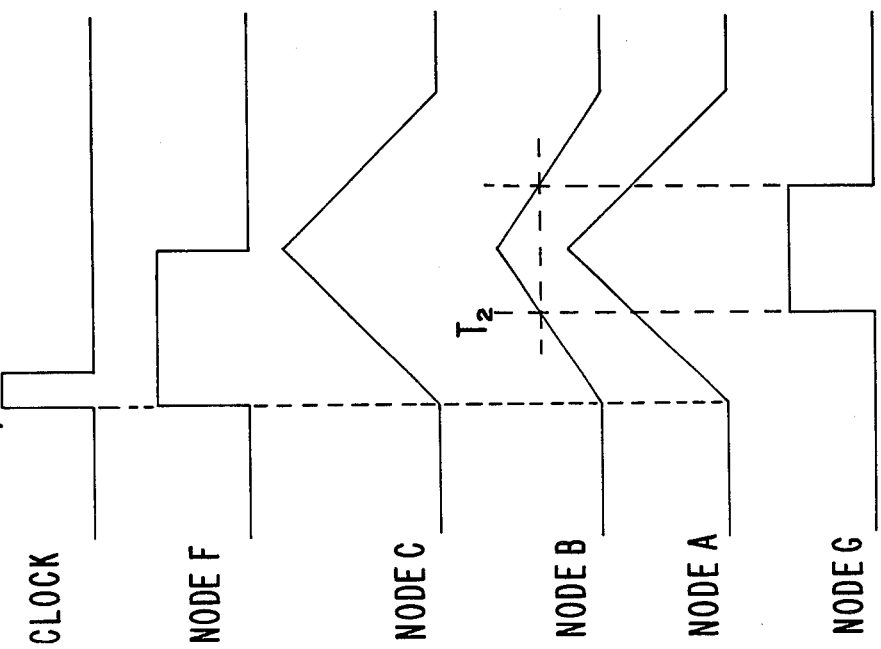
FIG. 2 is a timing diagram illustrating the read operation of the sense amplifier circuit.

Initiallly, the enabling signal supplied to terminal S of flip-flop 20 is low, and none of the word lines W are high. This is shown by the condition prior to time T1 in FIG. 2. The clock or enabling pulse, shown in the timing diagram designated "clock" in FIG. 2, sets the enabling flip-flop 20 and initiates the read cycle. Line F then goes high, which in conjunction with the address information supplied to the appropriate terminal ADDR1, causes the addressed word line W1 to go high.

Next, assume that transistor Q2 is initially on at the beginning of the read cycle. Node A is therefore more negative than node B. The rising potential of node C will cause diode D1 to become forward biased, and therefore node A will begin rising with the positive going edge on node C. Node B is driven positive by the positive going edge on node A and the capacitive coupling C12 between nodes A and B. Node B, however, will rise more slowly than node A because of the dividing action between capacitance C12 and C2, but will remain more positive than node A. When node B becomes sufficiently positive at time T2, transistor Q1 will begin competing with transistor Q5 for bit line current, thereby turning off transistor Q5. This will cause the SADO 1 output terminal at the collector of Q5 to rise and reset enabling flip-flop 20. At the same time the SADO 1 signal will set the output flip-flop 33 to provide a "data out" signal when the word line is deaddressed. Resetting of the enabling flip-flop 20 causes the enabling line F to go low and to deaddress the word line, thereby returning the sense amplifier to its initial state.

The read operation of the sense amplifier circuit allows the read threshold at terminals WRC 1 and WRC 0 to be set at a value slightly greater than the level of the deaddressed word line, thereby improving read access time. Furthermore, the system begins returning the addressed word line to its deaddressed condition as soon as the data has been received at the output flip-flop 33, by virtue of the connections to OR gate 22. This makes it unnecessary to recover the word line which is being deaddressed at the beginning of each cycle, also improving the read access time.

Figure 3:
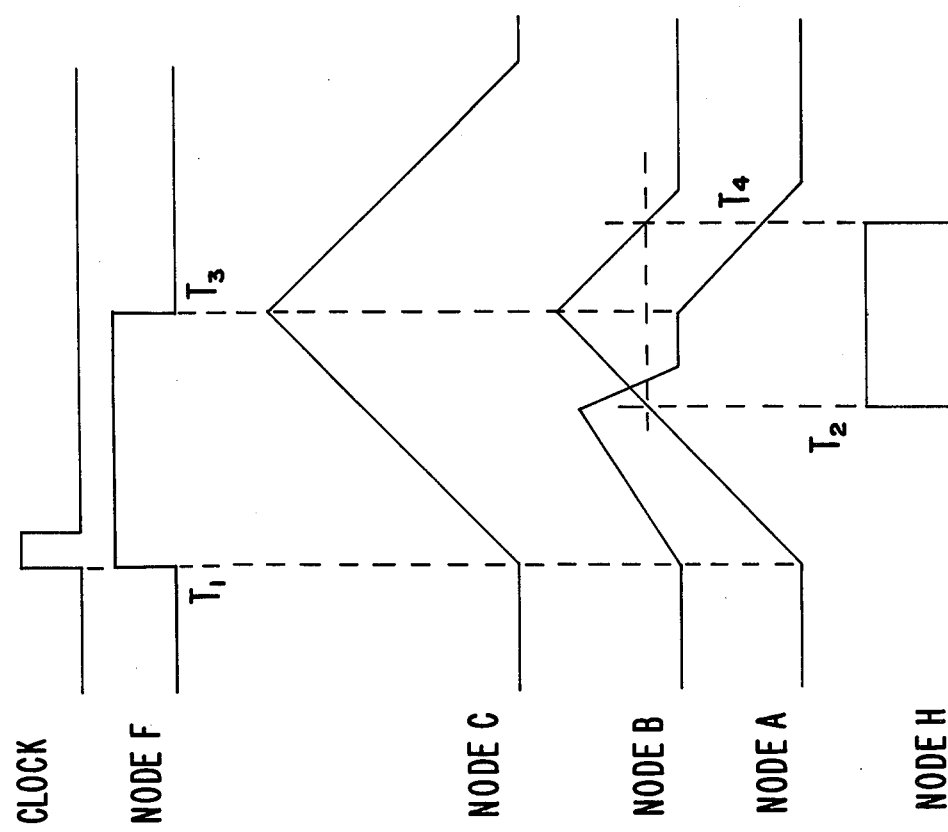
FIG. 3 is a timing diagram illustrating the write operation of the sense amplifier circuit.

The operation of the write cycle is similar to that of the read cycle. Assume that transistor Q2 is initially on, representing one state of the memory cell, and it is desired to turn on transistor Q3 to represent the other state of the memory cell. This is achieved by raising the potential of the base of transistor Q5 (node WRC 1) to a higher potential than node WRC 0. Node WRC 0 is held at the read potential, and when the voltage at node A becomes sufficiently positive to turn on transistor Q4, node B will become more negative than node A and turn off transistor Q6. The resultant output signal at node H (SADO 0) propagates through gate 22, and resets the enabling flip-flop 20. The word line begins to return to the deaddressed level. This operation is more clearly illustrated in FIG. 3 in which the relative potentials of nodes A, B, C, F, and H are shown. The advantage of the manner in which data is written into the memory cell using the sense amplifier circuit of this invention is that the writing occurs when the cell is most ready to change states. The positive going signal on the most negative cell node reduces the cell logic swing.

Although one embodiment of the circuit of this invention has been described above, this embodiment is intended to illustrate the invention. The scope of the invention may be ascertained from the appended claims.

I claim:

1. A circuit for use in controlling a memory cell coupled to a word line and to first and second bit lines comprising:
   an enabling flip-flop having first and second input terminals, and having an output terminal, the first terminal for being connected to a source of enabling signals;
   a word line addressing circuit connected to the output of the enabling flip-flop and to the word line, and having an address terminal for receiving address information;
   first and second read/write circuits connected to corresponding first and second bit lines, each of the read/write circuits including a control node for receiving control signals and an output node; and
   logic gate means having an output connected to the second input terminal of the enabling flip-flop, and having first and second input nodes connected to the corresponding output node of each of the first and second read/write circuits.

2. A circuit as in claim 1 wherein each of the first and second read/write circuits comprises a transistor having a base connected to the control node, an emitter connected to the bit line, and a collector connected to the output node.

3. A circuit as in claim 2 wherein each of the first and second read/write circuits further comprises a current sink connected to the corresponding bit line.

4. A circuit as in claim 3 wherein each of the first and second read/write circuits further comprises a resistor connected between the collector and a first potential source.

5. A circuit as in claim 1 wherein the word line addressing circuit comprises:
   an addressing transistor having a base coupled to the address terminal for receiving address information, an emitter connected to the word line, and a collector connected to a second potential source; and
   a resistor connected between the base and a third potential source.

6. A circuit as in claim 5 wherein:
   a first diode is connected between the base and the enabling flip-flop; and
   a second diode is connected between the base and the address terminal.

7. A circuit as in claim 1 wherein the logic gate means comprises an OR.

8. A circuit as in claim 1 further comprising an output flip-flip connected to the output node of each of the first and second read/write circuits.

9. A circuit for use in controlling a memory cell coupled to a word line and to first and second bit lines comprising:
   an enabling flip-flop having first and second input terminals, and having an output terminal, the first input terminal being connected to a source of enabling signals;
   a word line addressing circuit connected to the output terminal of the enabling flip-flop and to the word line, and having an address terminal for receiving address information, the word line addressing circuit including an addressing transistor having a base coupled to the address terminal, an emitter connected to the word line, and a collector connected to a potential source;
   first and second read/write circuits connected to corresponding first and second bit lines, each of the read/write circuits including a control node for receiving control signals and an output node, each of the first and second read/write circuits also including a transistor having a base connected to the control node, an emitter connected to the bit line, and a collector connected to the output node;
   logic gate means having an output connected to the second input terminal of the enabling flip-flop and having first and second input nodes connected to the corresponding output node of each of the first and second read/write circuits; and
   an output flip-flop coupled to the output node of each of the first and second read/write circuits.

* * * * *